United States Patent
Sun et al.

(10) Patent No.: US 11,332,665 B2
(45) Date of Patent: May 17, 2022

(54) PHOSPHORS AND PREPARATION METHOD THEREOF AS WELL AS WHITE LED

(71) Applicants: Fuzhou BOE Optoelectronics Technology Co., Ltd., Fujian (CN); BOE Technology Group Co., Ltd., Beijing (CN)

(72) Inventors: Shaojun Sun, Beijing (CN); Yajiao Zhang, Beijing (CN); Guiguang Hu, Beijing (CN); Junxiang Lu, Beijing (CN); Yanfei Chi, Beijing (CN); Xia Chen, Beijing (CN)

(73) Assignees: Fuzhou BOE Optoelectronics Technology Co., Ltd., Fuzhou (CN); BOE Technology Group Co., Ltd., Beijing (CN)

( * ) Notice: Subject to any disclaimer, the term of this patent is extended or adjusted under 35 U.S.C. 154(b) by 352 days.

(21) Appl. No.: 16/474,654

(22) PCT Filed: Nov. 23, 2018

(86) PCT No.: PCT/CN2018/117305
§ 371 (c)(1),
(2) Date: Jun. 28, 2019

(87) PCT Pub. No.: WO2019/205614
PCT Pub. Date: Oct. 31, 2019

(65) Prior Publication Data
US 2021/0403807 A1 Dec. 30, 2021

(30) Foreign Application Priority Data
Apr. 27, 2018 (CN) .......................... 201810394609.X

(51) Int. Cl.
*C09K 11/77* (2006.01)
*H01L 33/50* (2010.01)

(52) U.S. Cl.
CPC .......... *C09K 11/778* (2013.01); *H01L 33/502* (2013.01)

(58) Field of Classification Search
CPC ............................ C09K 11/778; H01L 33/502
See application file for complete search history.

(56) References Cited

U.S. PATENT DOCUMENTS 4,926,091 A * 5/1990 Verlijsdonk ........ C09K 11/7755
252/301.4 R

FOREIGN PATENT DOCUMENTS

| CN | 104830335 A | 8/2015 |
|---|---|---|
| CN | 104830336 A | 8/2015 |
| CN | 104927857 A | 9/2015 |
| CN | 106149056 A | 11/2016 |
| CN | 107057700 A | 8/2017 |
| CN | 108342193 A | 7/2018 |

OTHER PUBLICATIONS

Chemical Abstract citation 2014:1363656, 162:3452111, 2014.*
Chinese Office Action dated Jul. 26, 2019 for corresponding application CN 201810394609.X.
ISR for PCT/CN2018/117305 issued Feb. 19, 2019.
Jingjie et al. "Luminescence and energy transfer mechanism of a-Ba3Y(B03)3:Ce3±,Tb3±" Journal of Luminescence, available online Aug. 21, 2017.

* cited by examiner

*Primary Examiner* — C Melissa Koslow
(74) *Attorney, Agent, or Firm* — ArentFox Schiff LLP; Michael Fainberg

(57) ABSTRACT

Disclosed are a phosphors, a preparation method thereof and a white LED. The phosphors with a chemical formula being α-Ba3Y1-x(BO3)3:xDy3+ is obtained by doping Dy3+ and is a single-matrix phosphors which can be excited by near-ultraviolet light to emit white light.

8 Claims, 5 Drawing Sheets

PHOSPHORS AND PREPARATION METHOD THEREOF AS WELL AS WHITE LED

The application is a National Stage of International Application No. PCT/CN2018/117305, filed Nov. 23, 2018, which claims the priority of the published Chinese patent entitled as "Phosphors and Preparation Method thereof and submitted to the Patent Office of the People's Republic of China on Apr. 27, 2018 with the publication number being 201810394609.X, both of which are incorporated herein by reference in their entireties.

FIELD

The disclosure relates to the technical field of display, in particular to a phosphors and a preparation method thereof as well as a white LED.

BACKGROUND

At present, white light of white light-emitting diodes is mainly obtained by coating a near-ultraviolet (350-410 nm) chip with red, green and blue trichromatic phosphors and modulating the three primary colors emitted by the phosphors.

SUMMARY

According to a phosphors provided by some embodiments of the disclosure, the chemical formula of the phosphors is $\alpha\text{-}Ba_3Y_{1-x}(BO_3)_3\text{:}xDy^{3+}$, wherein x represents a mole percent of $Dy^{3+}$ in the phosphors, and x is greater than 0 and smaller than or equal to 0.2.

Optionally, according to the phosphors provided by some embodiments of the disclosure, x is equal to 0.08.

Some embodiments of the disclosure further provides a preparation method of phosphors, including steps:

respectively weighing solid compounds corresponding to elements in a chemical formula $\alpha\text{-}Ba_3Y_{1-x}(BO_3)_3\text{:}xDy^{3+}$ of the phosphors as raw materials according to a molar ratio of Ba to Y to B to Dy being 3:1-x:3:x, wherein x represents the mole percent of $Dy^{3+}$ in the phosphors, and x is greater than 0 and smaller than or equal to 0.2;

grinding and uniformly mixing weighed raw materials to obtain a raw material mixture;

pre-calcining the raw material mixture at a first preset temperature for first preset time, and naturally cooling pre-calcined mixture to room temperature to obtain a pre-calcined product;

grinding obtained pre-calcined product, calcining ground pre-calcined product at a second preset temperature for second preset time, and then naturally cooling calcined ground pre-calcined product to room temperature to obtain a calcined product; and grinding obtained calcined product to obtain the phosphors.

Optionally, according to the preparation method provided by some embodiments of the disclosure, the first preset temperature is lower than the second preset temperature.

Optionally, according to the preparation method provided by some embodiments of the disclosure, the first preset temperature is higher than or equal to 500 DEG C. and lower than or equal to 700 DEG C., and the second preset temperature is higher than or equal to 1000 DEG C. and lower than or equal to 1200 DEG C.

Optionally, according to the preparation method provided by some embodiments of the disclosure, the first preset time is shorter than the second preset time.

Optionally, according to the preparation method provided by some embodiments of the disclosure, the first preset time is 24 hours, and the second preset time is 48 hours.

Optionally, according to the preparation method provided by some embodiments of the disclosure, the time of each grinding process among grinding the raw materials, grinding the pre-calcined product, and grinding the calcined product is at least 30 min.

Optionally, according to the preparation method provided by some embodiments of the disclosure, the solid compound corresponding to the Ba element is $BaCO_3$, the solid compound corresponding to the B element is $H_3BO_3$, the solid compound corresponding to the Y element is $Y_2O_3$, and the solid compound corresponding to the Dy element is $Dy_2O_3$.

Optionally, according to the preparation method provided by some embodiments of the disclosure, a purity of $BaCO_3$ and $H_3BO_3$ refers to analytical purity, and a purity of $Y_2O_3$ and $Dy_2O_3$ refers to high purity.

Some embodiments of the disclosure further provides a white LED including an ultraviolet excitation layer, wherein the ultraviolet excitation layer includes the phosphors according to claim 1 or 2.

DETAILED DESCRIPTION OF THE EMBODIMENTS

In order to make the objectives, technical schemes and advantages of the disclosure clearer, specific embodiments of the phosphors and the preparation method thereof provided by some embodiments of the disclosure will be described in detail below with reference to the attached drawings.

Some embodiments of the disclosure provide the phosphors and the preparation method thereof, and thus the problems of color reabsorption and ratio regulation among trichromatic phosphors in white light-emitting diodes adopting ultraviolet light for exciting the trichromatic phosphors in the related art are solved.

Based on the problems in the related art, some embodiments of the disclosure provide a phosphors with the chemical formula being $\alpha\text{-}Ba_3Y_{1-x}(BO_3)_3\text{:}xDy^{3+}$, wherein x represents the mole percent of $Dy^{3+}$ in the phosphors, and x is greater than 0 and smaller than or equal to 0.2.

Optionally, according to the phosphors provided by some embodiments of the disclosure, the phosphors with the chemical formula being $\alpha\text{-}Ba_3Y_{1-x}(BO_3)_3\text{:}xDy^{3+}$ is obtained by doping $Dy^{3+}$ and is a single-matrix phosphors which can be excited by near-ultraviolet light to emit white light, color reabsorption among multi-primary phosphors and energy loss in the related art can be avoided, and therefore the luminous efficiency of white LEDs is improved; the problem of color drift caused by multi-primary phosphors ratio regulation and different lifetime decay can be avoided; and in addition, the phosphors disclosed by the disclosure is simple in preparation method, low in production cost, high in luminous intensity and good in stability, can be effectively excited by near ultraviolet light, and can be used for white LED display illumination or backlights of liquid crystal displays.

Figure 1:
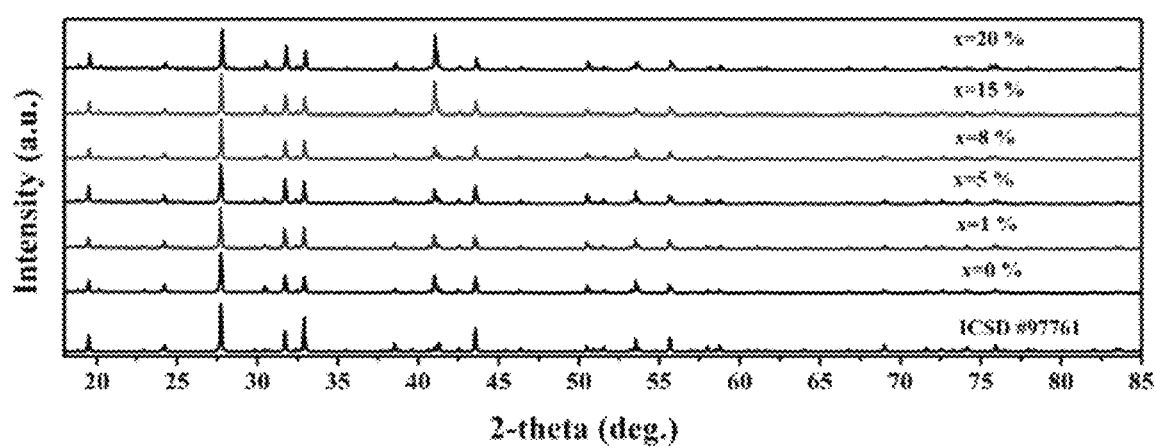
FIG. 1 shows an XRD pattern of a phosphors provided by some embodiments of the disclosure.

Optionally, according to the phosphors provided by some embodiments of the disclosure, the mole percent x of $Dy^{3+}$ in the phosphors can be 0.01, 0.05, 0.08, 0.10, 0.15 or 0.20. As shown in FIG. 1, X-ray diffraction (XRD) spectrograms with the $Dy^{3+}$ doping concentrations x being 0%, 1%, 5%, 8%, 10% and 20% are illustrated respectively, it can be seen that the diffraction peaks of the phosphors with the chemical formula being $\alpha\text{-}Ba_3Y_{1-x}(BO_3)_3{:}xDy^{3+}$ of the disclosure are consistent with the diffraction peaks of an $\alpha\text{-}Ba_3Y(BO_3)_3$ standard card ICSD #97761, impure peaks are avoided, a pure phase is displayed, which indicates that the position of $Y^{3+}$ ions are well substituted by $Dy^{3+}$ ions which are doped into $\alpha\text{-}Ba_3Y(BO_3)_3$, and the crystal structure of $\alpha\text{-}Ba_3Y(BO_3)_3$ is not changed.

Figure 2:
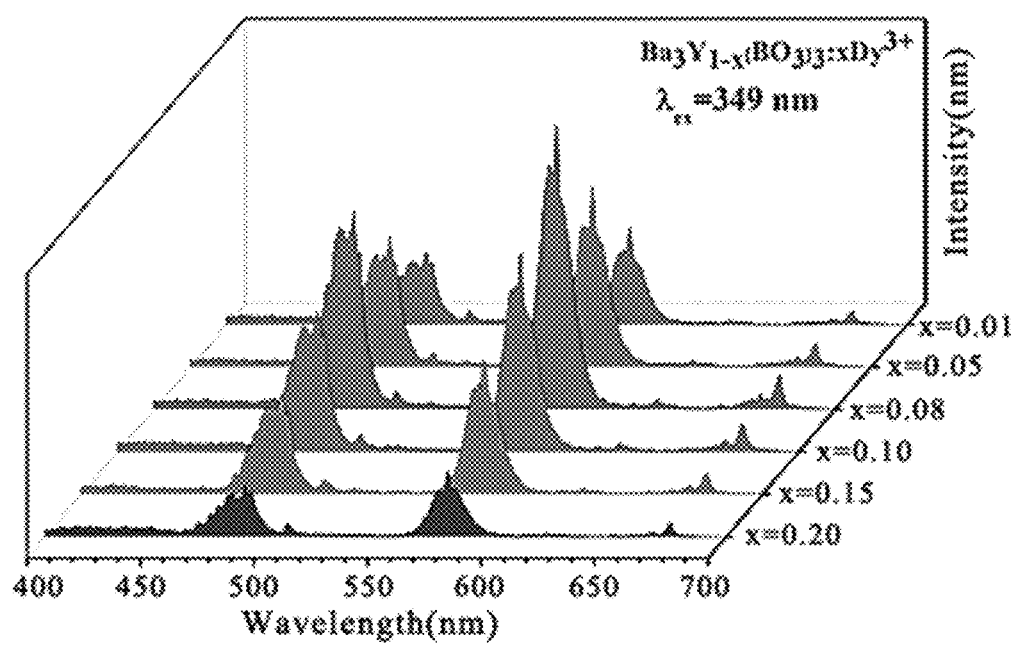
FIG. 2 shows an emission spectrogram of phosphors with different doping concentrations according to some embodiments of the disclosure.

Optionally, according to the phosphors provided by some embodiments of the disclosure, as shown in FIG. 2, an emission spectrogram obtained by exciting the phosphors with the chemical formula being $\alpha\text{-}Ba_3Y_{1-x}(BO_3)_3{:}xDy^{3+}$ and with different $Dy^{3+}$ doping concentrations provided by some embodiments of the disclosure under the excitation of the same excitation wavelength of 349 nm is illustrated, it is observed that the emission light intensity is highest when the mole percent x of $Dy^{3+}$ in the phosphors is 0.08, and fluorescence quenching of emission light intensity occurs when the doping concentration is higher than 0.08, so that the emission light intensity of the phosphors obtained when the $Dy^{3+}$ doping concentration in the phosphors is 0.08 is highest.

Figure 3:
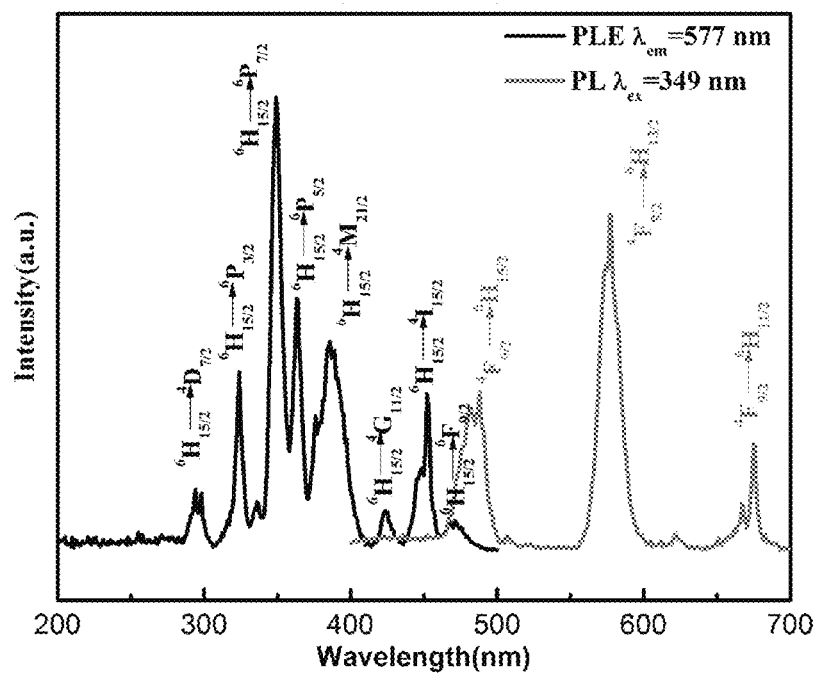
FIG. 3 shows an excitation emission spectrogram of a phosphors provided by some embodiments of the disclosure.

Optionally, according to the phosphors provided by some embodiments of the disclosure, as shown in FIG. 3, an excitation spectrogram (with black spectral lines on the left side) of $\alpha\text{-}Ba_3Y_{1-x}(BO_3)_3{:}xDy^{3+}$ and an emission spectrogram (with gray spectral lines on the right side) which are provided by some embodiments of the disclosure are illustrated, it can be seen from the excitation spectrum that the excitation wavelength range of the phosphors ranges from 290 nm to 390 nm, therefore, near-ultraviolet light excitation of the phosphors to emit light is achieved, it can be seen from the excitation spectrum that the excitation is highest when the excitation wavelength is 349 nm, so that the optimal excitation wavelength of the phosphors is 349 nm, thus, the emission light intensity of the phosphors obtained by doping $Dy^{3+}$ is highest, and according to the emission spectrum shown in FIG. 3, the emission spectrum of the phosphors with the chemical formula being $\alpha\text{-}Ba_3Y_{1-x}(BO_3)_3{:}xDy^{3+}$ is in a three-peak emission form when the phosphors is excited by 349-nm near-ultraviolet light and shows 489-nm blue light, 577-nm green light and 676-nm red light which correspond to magnetic dipole transition of $^4F_{9/2}\text{-}^6H_{15/2}$, electric dipole transition of $^4F_{9/2}\text{-}^6H_{13/2}$ and electric dipole transition of $^4F_{9/2}\text{-}^6H_{15/2}$; and by detecting the excitation spectrum at 577 nm, the excitation peaks distributed in the range of 270 nm-500 nm are mainly derived from energy level transition of the ground state $^4F_{9/2}\text{-}^6H_{15/2}$ to the excited state $^4F^9$ of $Dy^{3+}$. The peaks of the excitation spectrum shown in FIG. 3 show absorption transition of $^6H_{15/2}\text{-}^4D_{7/2}$ (292 nm), $^6H_{15/2}\text{-}^6P_{3/2}$ (324 nm), $^6H_{15/2}\text{-}^6P_{7/2}$ (349 nm), $^6H_{15/2}\text{-}^6P_{5/2}$ (364 nm), $^6H_{15/2}\text{-}^4M_{21/2}$ (386 nm), $^6H_{15/2}\text{-}^4G_{11/2}$ (423 nm), $^6H_{15/2}\text{-}^4I_{15/2}$ (451 nm) and $^6H_{15/2}\text{-}^6F_{9/2}$ (469 nm).

Figure 4:
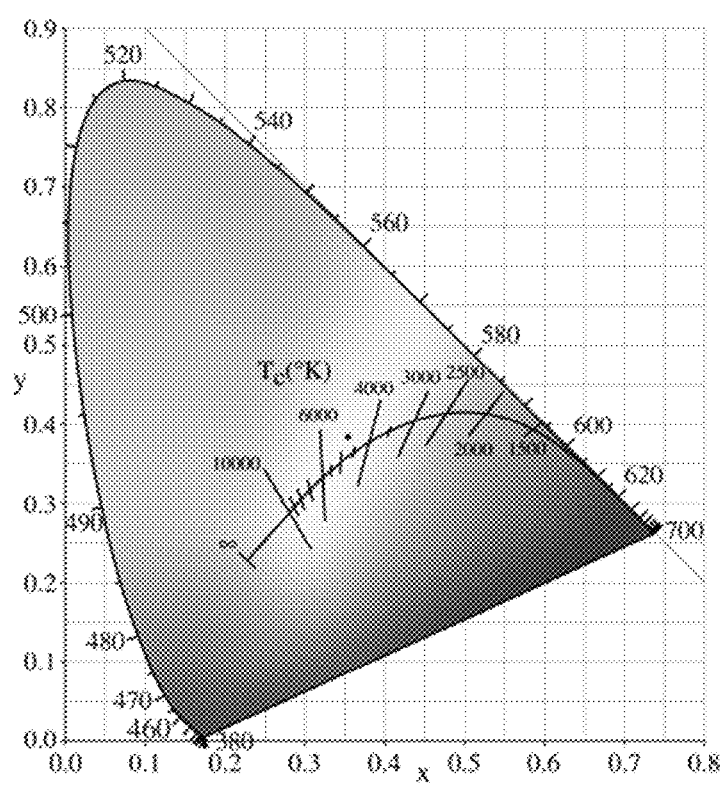
FIG. 4 shows a chromaticity coordinate diagram of a phosphors provided by some embodiments of the disclosure.

Optionally, according to the phosphors provided by some embodiments of the disclosure, as shown in FIG. 4, when the excitation wavelength $\lambda_{ex}$ is 349 nm, the chromaticity coordinates of the phosphors with the chemical formula being $\alpha\text{-}Ba_3Y_{1-x}(BO_3)_3{:}xDy^{3+}$ can be calculated to be (0.342, 0365) according to the emission spectrum shown in FIG. 3, the chromaticity coordinates matches with the chromaticity coordinates of white light well, the effect that the single-matrix phosphors is excited by near-ultraviolet light to emit white light is achieved, and thus the phosphors can be applied to white LEDs or backlights of LCDs.

Figure 5:
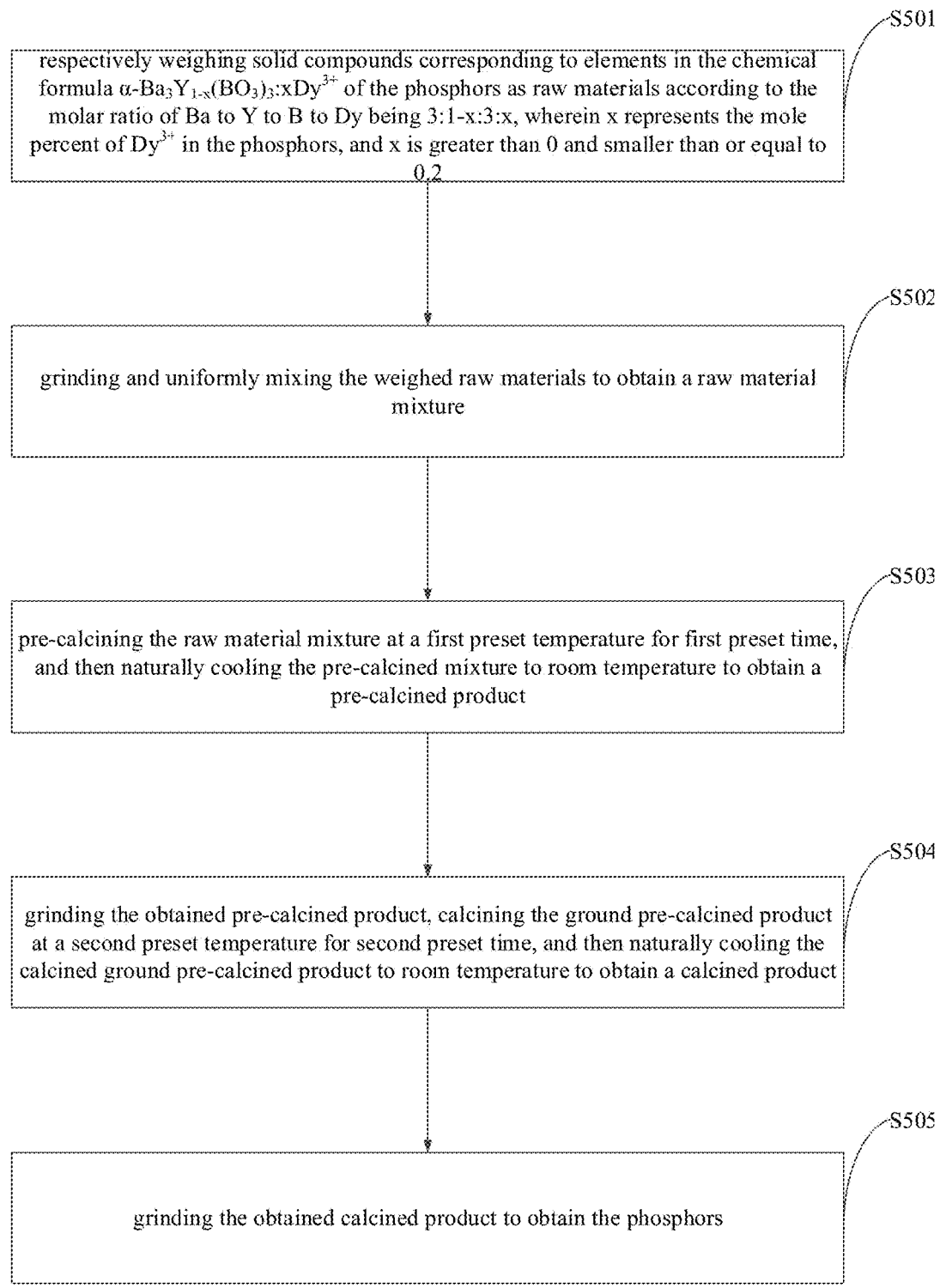
FIG. 5 shows a flow chart of a phosphors preparation method provided by an embodiment of the disclosure.

Based on the same inventive concept, some embodiments of the disclosure further provide a preparation method of the phosphors, as shown in FIG. 5, including the steps:

S501, respectively weighing solid compounds corresponding to elements in the chemical formula $\alpha\text{-}Ba_3Y_{1-x}(BO_3)_3{:}xDy^{3+}$ of the phosphors as raw materials according to the molar ratio of Ba to Y to B to Dy being 3:1-x:3:x, wherein x represents the mole percent of $Dy^{3+}$ in the phosphors, and x is greater than 0 and smaller than or equal to 0.2;

S502, grinding and uniformly mixing the weighed raw materials to obtain a raw material mixture;

S503, pre-calcining the raw material mixture at a first preset temperature for first preset time, and then naturally cooling the pre-calcined mixture to room temperature to obtain a pre-calcined product;

S504, grinding the obtained pre-calcined product, calcining the ground pre-calcined product at a second preset temperature for second preset time, and then naturally cooling the calcined ground pre-calcined product to room temperature to obtain a calcined product; and S505, grinding the obtained calcined product to obtain the phosphors.

Optionally, according to the preparation method of the phosphors provided by some embodiments of the disclosure, the phosphors with the chemical formula being $\alpha\text{-}Ba_3Y_{1-x}(BO_3)_3{:}xDy^{3+}$ is obtained by doping $Dy^{3+}$ and is a single-matrix phosphors which can be excited by near-ultraviolet light to emit white light, color reabsorption among multi-primary phosphors and energy loss in the related art can be avoided, and therefore the luminous efficiency is improved; the problem of color drift caused by multi-primary phosphors ratio regulation and different lifetime decay can be avoided; and in addition, the phosphors disclosed by the disclosure is simple in preparation method, low in production cost, high in luminous intensity and good in stability, can be effectively excited by near-ultraviolet light, and can be used for white LED display illumination or backlights of liquid crystal displays.

During specific implementation, since the solid compound corresponding to the Ba element in the chemical formula $\alpha\text{-}Ba_3Y_{1-x}(BO_3)_3{:}xDy^{3+}$ of the phosphors is $BaCO_3$, the solid compound corresponding to the B element in the chemical formula is $H_3BO_3$, and the purity of $BaCO_3$ and $H_3BO_3$ is high, the two solid compounds are decomposed and generate gas in the calcination process if the two solid compounds are calcinated directly, which goes against better crystallization of the phosphors with the chemical formula being $\alpha\text{-}Ba_3Y_{1-x}(BO_3)_3{:}xDy^{3+}$. Therefore, in order to obtain the phosphors with better crystallinity, the raw material mixture is generally pre-calcinated within a temperature range which is lower than the crystallization temperature of the phosphors, thus, the raw material mixture is decomposed to remove gas generated by decomposition and obtain corresponding oxides, and the oxides are calcined to obtain the phosphors with good crystallinity, so that the first preset temperature is lower than the second preset temperature according to the preparation method provided by some embodiments of the disclosure.

Optionally, according to the preparation method provided by some embodiments of the disclosure, the first preset temperature can be higher than or equal to 500 DEG C. and lower than or equal to 700 DEG C., and the raw material mixture can be decomposed well within the temperature range; and the second preset temperature can be higher than or equal to 1000 DEG C. and lower than or equal to 1200 DEG C., and the phosphors with good crystallinity can be obtained through calcination within the temperature range.

Optionally, according to the preparation method provided by some embodiments of the disclosure, due to the material properties of the raw material mixture, the decomposition temperature is 700 DEG C. preferably, the first preset temperature can be 700 DEG C., due to the preferred temperature of the crystallization point of the phosphors with the chemical formula being $\alpha\text{-Ba}_3Y_{1-x}(BO_3)_3:xDy^{3+}$ is 1100 DEG C., the second preset temperature can be 1100 DEG C., thus, the obtained phosphors with the chemical formula being $\alpha\text{-Ba}_3Y_{1-x}(BO_3)_3:xDy^{3+}$ is an α crystal phase, and the crystallinity is good.

Optionally, the raw material mixture is pre-calcinated with the main purpose that the raw material mixture is decomposed so that gas can be removed, in the subsequent calcination process, crystallization of the phosphors is more perfect, the pre-calcination time should not be too long generally, so according to the preparation method provided by some embodiments of the disclosure, the first preset time is shorter than the second preset time. Thus, the raw material mixture is allowed to be sufficiently decomposed, and the phosphors with the chemical formula being $\alpha\text{-Ba}_3Y_{1-x}(BO_3)_3:xDy^{3+}$ and good crystallinity can be obtained.

Optionally, according to the preparation method provided by some embodiments of the disclosure, in order to enable the raw material mixture to be decomposed more fully, the first preset time is 24 hours generally, and in order to make the phosphors crystallize more perfectly, the second preset time is 48 hours. Thus, the phosphors with the chemical formula being $\alpha\text{-Ba}_3Y_{1-x}(BO_3)_3:xDy^{3+}$ and good crystallinity can be obtained.

Optionally, according to the preparation method provided by some embodiments of the disclosure, the time of each grinding process among grinding the raw materials, grinding the pre-calcined product, and grinding the calcined product is at least 30 min, so that sufficient grinding is ensured, and the phosphors with good crystallinity is formed.

Optionally, according to the preparation method provided by some embodiments of the disclosure, the solid compound corresponding to the Ba element is $BaCO_3$, the solid compound corresponding to the B element is $H_3BO_3$, the solid compound corresponding to the Y element is $Y_2O_3$, and the solid compound corresponding to the Dy element is $Dy_2O_3$.

Optionally, according to the preparation method provided by some embodiments of the disclosure, the purity of $BaCO_3$ and $H_3BO_3$ refers to analytical purity (99.9%), and the purity of $Y_2O_3$ and $Dy_2O_3$ refers to high purity (99.99%).

Optionally, according to the preparation method provided by some embodiments of the disclosure, grinding can be performed in a manual mode or through a ball mill, when the required grinding time is short, grinding may be performed manually, when the required grinding time is long, the ball mill may be used for grinding, and thus modes can be selected according to requirements and are not limited here.

Optionally, according to the preparation method provided by some embodiments of the disclosure, grinding can be performed in an agate mortar, the pre-calcination process and the calcination process may be performed through a muffle furnace without being limited to the mode, and any means capable of achieving the same purpose is applicable to the disclosure and is not specifically limited here.

Based on the same inventive concept, some embodiments of the disclosure further provide a white LED which includes an ultraviolet excitation layer, wherein the ultraviolet excitation layer includes the phosphors disclosed by some embodiments. The specific structure of the white LED is consistent with the structure of a white LED in the related art and is not described in detail herein.

According to the phosphors and the preparation method thereof which are provided by some embodiments of the disclosure, the phosphors with the chemical formula being $\alpha\text{-Ba}_3Y_{1-x}(BO_3)_3:xDy^{3+}$ is a single-matrix phosphors which is obtained by doping $Dy^{3+}$ and can be excited by near-ultraviolet light to emit white light, color reabsorption between multi-primary phosphors and energy loss in the related art can be avoided, and therefore the luminous efficiency is improved; the problem of color drift caused by multi-primary phosphors ratio regulation and different lifetime decay can be avoided; and in addition, the phosphors disclosed by the disclosure is simple in preparation method, low in production cost, high in luminous intensity and good in stability, can be effectively excited by near-ultraviolet light, and can be used for white LED display illumination or backlights of liquid crystal displays.

It is apparent to those skilled in the art that various changes and modifications can be made to the disclosure without departing from the spirit and scope of the disclosure. Thus, if modifications and variations of the disclosure are within the scope of the claims of the disclosure and the equivalent technologies, the disclosure is also intended to include these modifications and variations.

The invention claimed is:

1. A phosphors, wherein a chemical formula of the phosphors is $\alpha\text{-Ba}_3Y_{1-x}(BO_3)_3:xDy^{3+}$, wherein x represents a mole percent of $Dy^{3+}$ in the phosphors, and x is greater than 0 and smaller than or equal to 0.2.

2. The phosphors according to claim 1, wherein x is equal to 0.08.

3. A preparation method of phosphors, comprising:
respectively weighing solid compounds corresponding to elements in a chemical formula $\alpha\text{-Ba}_3Y_{1-x}(BO_3)_3:xDy^{3+}$ of the phosphors as raw materials according to a molar ratio of Ba to Y to B to Dy being 3:1-x:3:x, wherein x represents the mole percent of $Dy^{3+}$ in the phosphors, and x is greater than 0 and smaller than or equal to 0.2;
grinding and uniformly mixing weighed raw materials to obtain a raw material mixture;
pre-calcining the raw material mixture at a first preset temperature for first preset time, and naturally cooling the pre-calcined mixture to room temperature to obtain a pre-calcined product;
grinding obtained pre-calcined product, calcining ground pre-calcined product at a second preset temperature for second preset time, and naturally cooling calcined ground pre-calcined product to room temperature to obtain a calcined product; and
grinding obtained calcined product to obtain the phosphors;

wherein the first preset temperature is higher than or equal to 500 DEG C. and lower than or equal to 700 DEG C., and the second preset temperature is higher than or equal to 1000 DEG C. and lower than or equal to 1200 DEG C.; and the first preset time is 24 hours, and the second preset time is 48 hours.

4. The preparation method according to claim 3, wherein the time of each grinding procedure among said grinding the raw materials, said grinding the pre-calcined product, and said grinding the calcined product is at least 30 min.

5. The preparation method according to claim 3, wherein the solid compound corresponding to the Ba element is $BaCO_3$, the solid compound corresponding to the B element is $H_3BO_3$, the solid compound corresponding to the Y element is $Y_2O_3$, and the solid compound corresponding to the Dy element is $Dy_2O_3$.

6. The preparation method according to claim 5, wherein a purity of $BaCO_3$ and $H_3BO_3$ refers to analytic purity, and a purity of $Y_2O_3$ and $Dy_2O_3$ refers to high purity.

7. A white LED, comprising an ultraviolet excitation layer, wherein an ultraviolet excitation layer comprises the phosphors according to claim 1.

8. A white LED, comprising an ultraviolet excitation layer, wherein an ultraviolet excitation layer comprises the phosphors according to claim 2.

* * * * *